Z
(12) United States Patent
Luo

(10) Patent No.: US 6,417,735 B1
(45) Date of Patent: Jul. 9, 2002

(54) AMPLIFIER WITH BIAS COMPENSATION USING A CURRENT MIRROR CIRCUIT

(75) Inventor: Sifen Luo, Hartsdale, NY (US)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 10/020,076

(22) Filed: Dec. 7, 2001

(51) Int. Cl.$^7$ ................................................. H03F 3/04
(52) U.S. Cl. ...................... 330/296; 330/288; 330/302
(58) Field of Search ................................ 330/288, 296, 330/302

(56) References Cited

U.S. PATENT DOCUMENTS

| | | | | |
|---|---|---|---|---|
| 5,404,585 A | * | 4/1995 | Vimpari et al. | 455/115 |
| 5,548,248 A | | 8/1996 | Wang | 330/288 |
| 5,986,509 A | * | 11/1999 | Lohninger | 330/290 |
| 6,300,837 B1 | * | 10/2001 | Sowlati et al. | 330/296 |
| 6,333,677 B1 | * | 12/2001 | Dening | 330/296 |

* cited by examiner

Primary Examiner—Benny Lee
Assistant Examiner—Henry Choe
(74) Attorney, Agent, or Firm—Steven R. Biren

(57) ABSTRACT

A power amplifier circuit comprises an amplifying transistor and a dc bias circuit. The dc bias circuit comprises a first transistor in a current mirror with the amplifying transistor, and a second transistor to provide the base currents to both the amplifying transistor and the first transistor. A dc bias power source is coupled to the base of the second transistor through a resistor and an inductor connected in series. A bypass capacitor is coupled between a ground and a node between the resistor and the inductor. Thus, the reduced voltage drop across the base-emitter junction of the amplifying transistor due to an increased input power is compensated. Furthermore, by properly scaling the emitter area ratio between the amplifying transistor and the first transistor, and/or the ratio between a bias resistor and a corresponding resistor coupled with the mirroring first transistor, the quiescent current in the amplifying transistor can be made to be in direct proportion to that of the first transistor.

17 Claims, 1 Drawing Sheet

AMPLIFIER WITH BIAS COMPENSATION USING A CURRENT MIRROR CIRCUIT

FIELD OF THE INVENTION

This invention relates to transistor amplifier circuits, and more particularly, to an amplifier circuit having a bias compensation circuit for achieving higher output power and linearity as input power increases.

BACKGROUND OF THE INVENTION

A linear RF power amplifier is commonly biased in class AB operation so as to achieve higher power-added efficiency. Linearity and power-added efficiency are two contradictory requirements in a power amplifier. A tradeoff between the linearity and power-added efficiency is needed for given specifications for the power amplifier. It is usually done by achieving the highest power-added efficiency for a given linearity requirement. This requires good control of the quiescent current of the power amplifier. Prior art techniques that provided good control of the quiescent current of the amplifier transistor used a simple current-mirror circuit with current gain without a bypass capacitor (U.S. Pat. No. 5,548,248).

However, in a conventionally biased class AB amplifier, the average bias supply current increases as RF input power increases. This increased average current results in an increased voltage drop in the resistive part of the bias circuit. This in turn reduces the average voltage drop across the forward-biased PN junction of the power amplifying transistor, pushing the amplifier into class B and even class C operations. Therefore, the output power will be saturated as the input power further increases. To overcome this problem, a boosting circuitry is usually used to increase the bias of the power transistor, such as a bias boosting circuitry, a self-bias boost scheme or an adjustable self-bias boost scheme. These boosting schemes, however, are usually not simple and compact enough.

Therefore, the object of the present invention is to provide a power amplifier circuit with a novel-biasing scheme, which is simple but capable of providing higher power output as the input power increases, as well as of good control of quiescent current of the power transistor.

SUMMARY OF THE INVENTION

To achieve the above object, the amplifier circuit of the present invention comprises an amplifying transistor and a dc bias circuit. The dc bias circuit comprises a first transistor in a current mirror with the amplifying transistor, and a second transistor to provide the base currents to both the amplifying transistor and the first transistor. A dc bias power source is coupled to the base of the second transistor through a resistor and an inductor connected in series. In addition, a bypass capacitor is connected between the common node of the resistor and the inductor and the ground. With the capacitor, an effective impedance at the emitter of the second transistor at high frequencies is smaller than that without the capacitor. This effectively makes the voltage drop across the base-emitter junction of the amplifying transistor larger than that without the capacitor at the signal frequency and therefore compensates the voltage drop. Furthermore, by properly scaling the emitter area ratio between the amplifying transistor and the first transistor, and/or the ratio between a bias resistor and a corresponding resistor coupled with the mirroring first transistor, the quiescent current in the amplifying transistor can be made to be in direct proportion to that of the first transistor.

Preferably the bypassing capacitor is an off-chip capacitor to permit flexibility and adjustment.

BRIEF DESCRIPTION OF THE DRAWING

The above and other features and advantages of the present invention will be clearer from the detailed description of the preferred embodiment with reference to the accompanying drawing.

DETAILED DESCRIPTION OF THE INVENTION

Figure 1:
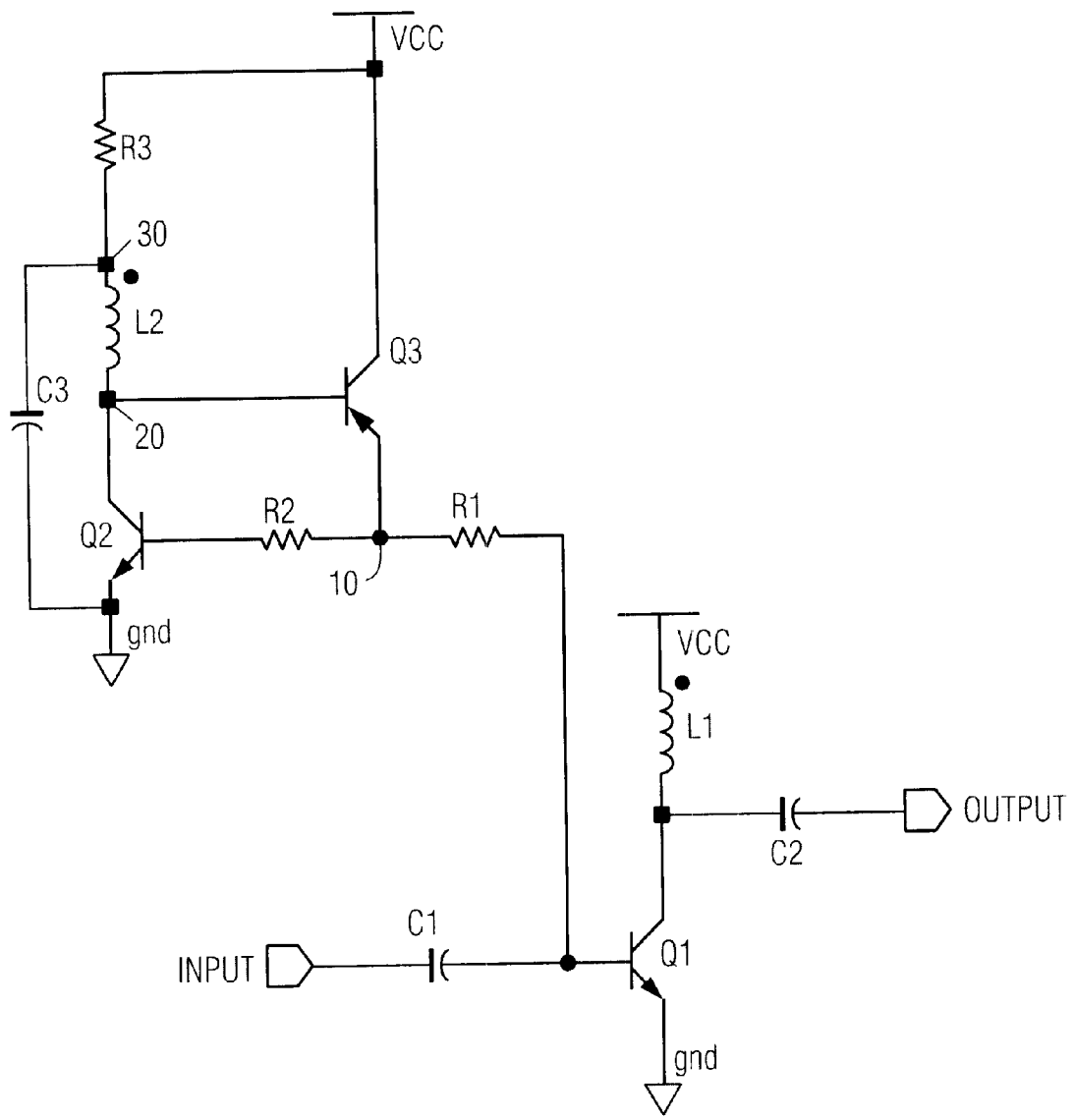
FIG. 1 is a simplified schematic diagram of a preferred embodiment of the power amplifier circuit in accordance with the present invention.

Reference is made to FIG. 1, which shows a preferred embodiment of the power amplifier circuit of the present invention. The inventive power amplifier circuit generally comprises an amplifying transistor Q1 and a dc bias circuit. In particular, the dc bias circuit comprises a transistor Q2 that is a current mirror of the amplifying transistor Q1 with both their emitters coupled to the common terminal (which is a common ground in this embodiment but may be connected to different ground terminals), and a transistor Q3 for providing base currents for both the transistors Q1 and Q2.

The collector node of the amplifying transistor Q1 is the output node that is coupled to a supply voltage through a pull-up inductor L1 and is also connected to an AC coupling capacitor C2. The inductor L1 and the capacitor C2 can be part of output matching for the transistor Q1. An RF input is applied to the base of the amplifying transistor Q1 through an AC coupling capacitor C1 that can be part of input matching for the transistor Q1.

As clearly shown in FIG. 1, the emitter of the transistor Q3 is coupled to both bases of the transistors Q1 and Q2 through a first common node 10 between a bias resistor R1 and a resistor R2, while the base of the transistor Q3 is directly coupled to the collector of the first transistor Q2 at a second common ground 20. The bias resistor R1 is coupled between the first common node 10 and the base of the amplifying transistor Q1, while the resistor R2 is coupled between the first common node 10 and the mirror transistor Q2.

A bias voltage source Vcc is coupled directly to the collector of the transistor Q3, and is also coupled to the second common node 20 through a resistor R3 and an inductor L2 connected in series at a third common node 30. A bypass capacitor C3 is connected between the common node of the resistor R3 and the inductor L2 and the ground. In particular, the capacitor C3 is effectively parallel to the resistor R3 at high frequencies, thus "bypassing" the resistor R3 for a current of high frequency.

As well known in the art, as an inherent function of the current mirroring between the amplifying transistor Q1 and the transistor Q2, by properly scaling the emitter area ratio between the transistor Q1 and Q2 and the ratio between the resistances of the bias resistor R1 and the resistor R2, the quiescent current in the amplifying transistor Q1 can be caused to be in direct proportion to that of the transistor Q2. For example, the emitter area ratio of transistor Q1 to transistor Q2 is scaled as 8 to 1. Thus, the quiescent current of the amplifying transistor Q1 is under good control.

By coupling the capacitor C3 to the resistor R3, the impedance between the emitter of the transistor Q3 and the dc bias voltage source Vcc (which is a ground terminal as to ac signals) decreases as the frequency of the ac input signal increases. This leads to a reduced voltage drop across that part of the bias impedance of the transistor Q1 and therefore compensates the voltage drop across the base-emitter junction of the amplifying transistor Q1 due to an increased voltage drop across the bias resistor R1 as the input signal level increases. The amplifier is therefore able to deliver more output power and its linear operation range is increased.

Preferably the bypassing capacitor C3 is an off-chip component whereby the compensation, which depends on the value of the capacitor C3, is adjustable by using different values of C3.

If an on-chip bypass capacitor is used for C3, the inductor L2 is preferably removed. The capacitor C3 is then connected between the base of the second transistor Q3 and the ground that has ground inductance due to bonding wires. However, a large on-chip capacitor may use large chip real estate, and the compensation may not be as effective as that from an off-chip capacitor.

While the invention has been described in detail with reference to the preferred embodiment, it should be appreciated that various changes and modifications are possible to those skilled in the art without departing from the scope of the invention. For example, the bypassing capacitor C3 may be an adjustable capacitor instead of a fixed component. The dc bias voltage Vcc can be replaced by a bias current source. Thus, the scope of the invention is intended to be solely defined in the accompanying claims.

What is claimed is:

1. An amplifier circuit comprising:
   an amplifying transistor;
   a dc bias circuit comprising:
   a first transistor forming a current mirror with said amplifying transistor with their bases coupled at a first common node and their emitters coupled to a common terminal;
   a second transistor having an emitter coupled to said first common node and a base coupled to a collector of said first transistor at a second common node;
   a bias power source coupled to said second common node through a resistor and an inductor connected in series at a third common node, and directly coupled to a collector of said second transistor as well;
   wherein said dc bias circuit further comprises a bypass capacitor coupled between said third common node and a ground.

2. The power amplifier circuit of claim 1 wherein said capacitor is an off-chip capacitor.

3. The power amplifier circuit of claim 1 wherein said capacitor is an adjustable capacitor.

4. The power amplifier circuit of claim 1 wherein said dc bias circuit further comprises a bias resistor coupled between said base of said amplifying transistor and said first common node, and another resistor coupled between said base of said first transistor and said first common node.

5. The power amplifier of claim 4 wherein an emitter area ratio between said amplifying transistor and said first transistor and a resistance ratio between said bias resistor and said another resistor are configured such that a quiescent current in said amplifying transistor is directly proportional to that in said first transistor.

6. The power amplifier of claim 5 wherein said emitter area ratio of said amplifying transistor to said first transistor is 8 to 1.

7. The power amplifier of claim 1 wherein said common terminal is a common ground.

8. A power amplifier circuit, comprising:
   an amplifying transistor;
   a dc bias circuit having a first transistor forming a current mirror with said amplifying transistor while a second transistor providing base currents for both of said amplifying transistor and said first transistor,
   a dc bias power source coupled directly to a collector of said second transistor and coupled to a base of said second transistor through a resistor and an inductor connected in series, wherein a bypass capacitor is coupled in parallel to said resistor.

9. The power amplifier circuit of claim 8 wherein said bypass capacitor is coupled between a ground and a node between said resistor and said inductor.

10. The power amplifier circuit of claim 9 wherein said capacitor is an off-chip capacitor.

11. The power amplifier circuit of claim 9 wherein said capacitor is an adjustable capacitor.

12. The power amplifier circuit of claim 8 wherein an emitter of said second transistor is coupled to both bases of said amplifying transistor and said first transistor at a first common node.

13. The power amplifier of claim 12 wherein an emitter area ratio between said amplifying transistor and said first transistor is configured such that a quiescent current in said amplifying transistor is directly proportional to that in said first transistor.

14. The power amplifier circuit of claim 12 wherein said dc bias circuit further comprises a bias resistance coupled between said first common node and the base of said amplifying transistor, and an another resistance coupled between said first common node and the base of said first transistor.

15. The power amplifier of claim 14 wherein a resistance ratio between said bias resistor and said another resistor is configured such that a quiescent current in said amplifying transistor is directly proportional to that in said first transistor.

16. The power amplifier of claim 14 wherein both an emitter area ratio between said amplifying transistor and said first transistor and a resistance ratio between said bias resistor and said another resistor are configured such that a quiescent current in said amplifying transistor is directly proportional to that in said first transistor.

17. The power amplifier circuit of claim 8 wherein said base of said second transistor is directly coupled to a collector of said first transistor at a second common node.

* * * * *